United States Patent [19]

Tropp et al.

[11] Patent Number: 5,041,790
[45] Date of Patent: Aug. 20, 1991

[54] DUAL-TUNED RF COIL FOR MRI SPECTROSCOPY

[75] Inventors: James S. Tropp, Berkeley; Kevin A. Derby, San Bruno, both of Calif.

[73] Assignee: Toshiba America MRI, Inc., So. San Francisco, Calif.

[21] Appl. No.: 466,021

[22] Filed: Jan. 16, 1990

[51] Int. Cl.⁵ ............................................ G01R 33/20
[52] U.S. Cl. .................................... 324/318; 324/322
[58] Field of Search ............... 324/300, 307, 308, 309, 324/310, 311, 312, 313, 318, 322

[56] References Cited

U.S. PATENT DOCUMENTS

| | | | |
|---|---|---|---|
| 4,050,009 | 9/1977 | Sagalyn | 324/308 |
| 4,502,008 | 2/1985 | Ohuchi | 324/311 |
| 4,751,464 | 6/1988 | Bridges | 324/318 |

*Primary Examiner*—Michael J. Tokar
*Attorney, Agent, or Firm*—Nixon & Vanderhye

[57] ABSTRACT

A hybrid bird cage/Helmholtz RF coil provides a single composite RF coil for MRI spectroscopy involving at least two NMR nuclear species at respectively different RF frequencies. The bird cage portion may be tuned to the lower NMR frequency and coupled to a pair of quadrature-phase input/output ports so as to provide needed extra sensitivity and signal-to-noise ratio. At least one further RF input/output port provides coupling for a second, higher, MNR RF frequency.

12 Claims, 5 Drawing Sheets

DUAL-TUNED RF COIL FOR MRI SPECTROSCOPY

This invention is generally related to magnetic resonance spectroscopic imaging (MRSI) utilizing nuclear magnetic resonance (NMR) phenomena. It is more particularly directed to a dual-tuned RF coil for coupling RF NMR signals to/from an MRI volume such that images for at least two different nuclear species may be provided by a single composite coil structure.

NMR for a single nuclear species (e.g., hydrogen nuclei or protons) is by now well-known and in common commercial usage. Although such MRI systems are quite complex in their totality, they all use RF coils in one way or another to couple NMR RF signals into an image volume--and to couple the resulting NMR RF responses from NMR nuclei out of the image volume. Based upon a complex sequence of imposed magnetic field pulses and RF NMR pulses, the measured RF NMR responses can be used to generate data for a cross-sectional image of the spatial distribution of NMR nuclei populations through the image volume.

In an attempt to provide efficient and relatively homogeneous RF field coupling to the image volume, numerous types of RF coil structures have been utilized. The NMR RF frequencies involved will depend upon the strength of the magnetic field, but, in common practice, NMR frequencies for hydrogen nuclei may range from a few MHz to 15 or more MHz.

Although not yet generally available on a commercial scale, systems are also now being developed for performing MRI spectroscopy or MRSI. In short, these systems are capable of separately imaging the NMR populations for different species of nuclei. In one type of MRI spectroscopy, hydrogen nuclei species ($^1H$ sometimes referred to as protons) as well as an isotope of phosphorus nuclei species $^{31}P$) can be separately imaged.

In such spectroscopic systems, the magnetic field strengths are generally necessarily much higher so as to make it possible to image nuclear species which are much less numerous or much less NMR sensitive than hydrogen nuclei. This causes the NMR frequencies for the various species to also be considerably higher. For example, if the nominal magnetic field strength is 2.0 Tesla, then the NMR RF frequency for hydrogen protons would be about 85.5 MHz while the NMR frequency for $^{31}P$ nuclear species would be about 34.5 MHz.

As will be appreciated by those in the art, the available population of hydrogen nuclei in the human body is much higher than that of $^{31}P$ nuclei. Accordingly, the required sensitivity and signal-to-noise ratio for successfully imaging $^{31}P$ nuclei is much more critical than for imaging hydrogen nuclei in human body tissue. At the present time, this also implies a need to make the minimum image resolution element (sometimes referred to as a "pixel" or "voxel") much larger for MRI "images" of $^{31}P$ nuclei than for hydrogen nuclei.

In the past, a so-called "bird cage" RF coil structure has been utilized for MRI applications. Various versions of such bird cage coils have been proposed by others including a dual-tuned "bandpass" type of bird cage resonator. This is one approach for providing a single RF coil structure capable of coupling NMR RF signals for two different nuclear species into and out of an image volume. However, it turns out to be a fairly complex arrangement.

Other types of conventional MRI RF coils include Helmholtz coils which are somewhat more simple to construct—but which typically result in less homogeneous RF field distributions within the image volume.

It is also known in prior MRI systems to use quadrature detection for enhanced sensitivity and/or signal-to-noise ratio when receiving very weak NMR RF responses from the image volume. As will be appreciated, such quadrature detection requires a pair of RF input/output ports for the coil structure, one of the ports being in quadrature phase relationship with respect to the other port at the RF frequency of interest.

Finally, various kinds of RF coupling circuits have been used for coupling RF input/output ports to MRI RF coil structures. One type of known coupling circuit is an inductively coupled loop. Another type of known coupling circuit involves coupling/impedance matching and/or tuning capacitors. The following publications (hereby incorporated by reference herein) may be considered related to this invention in manners that will be indicated more specifically throughout the following description:

1. J. TROPP and S. SUGIURA, "A dual-Tuned Probe and Multiband Receiver Front End for X-Nucleus Spectroscopy with Proton Scout Imaging In Vivo, *Magnetic Resonance in Medicine* Vol. 11, pp. 405-412 (1989).
2. D. W. ALDERMAN and D. M. J. GRANT, "An Efficient Decoupler coil Design which Reduces Heating in Conductive Samples in Superconducting Spectrometers", *Journal of Magnetic Resonance*, Vol. 36, ppa. 447-451 (1979).
3. J. TROPP J., "The Theory of the Bird-Cage Resonator", *Journal of Magnetic Resonance*, Vol. 82, pp. 51-62 (1989).
4. D. I. HOULT and P. C. LAUTERBUR J., "The Sensitivity of the Zeugmatographic Experiment Involving Human Samples", Journal of Magnetic Resonance. Vol. 34, pp. 425-433 (1979).
5. J. W. CARLSON, "Radiofrequency Field Propagation in Conductive NMR Samples", *Journal of Magnetic Resonance*, Vol. 78, pp. 563-573 (1980.
6. J. W. CARLSON, "Power Deposition and Noise Correlation in NMR Samples", *Magnetic Resonance in Medicine*, Vol. 10, pp. 399-403 (1989).
7. J. TROPP, S. SUGIURA, K. DERBY, Y. SUZUKI, C. HAWRYSZKO, H. YAMAGATA, J. KLEIN, D. ORTENDAHL, L. KAUFMAN, and G. ACOSTA, "Characterization of MR Spectroscopic Imaging of the Human Head and Limb at 2.0 T$^1$", *Radiology*, Vol. 169, pp. 207-212 (1988).
8. J. TROPP, K. DERBY, C. HAWRYSZKO, S. SUGIURA, and H. YAMAGATA, "Automated Shimming of $B_o$ for Spectroscopic Imaging", *Journal of Magnetic Resonance*, Vol. 85, pp. 244-254 (1989).
9. K. DERBY, C. HAWRYSZKO, and J. TROPP, "Baseline Correction and Voxel Shifting for Chemical Shift Imaging", *Abstracts of the 30th Experimental Nuclear Magnetic Resonance Spectroscopy Conference,* p. 181 (1989).
10. K. DERBY, C. HAWRYSZKO, and J. TROPP, "Baseline Deconvolution, Phase Correction, and Signal Quantification in Fourier Localized Spectroscopic Imaging", *Magnetic Resonance in Medicine*, Vol. 12, pp. 235-240 (1989).

The need for dual-tuned RF probes or coils in clinical spectroscopy of low gamma nuclei is well established. Such probes simplify patient set up, and allow the functions of scout imaging, shimming, and data collection to be performed in sequence, without disturbing or repositioning the patient. In developing techniques for $^{31}P$ spectroscopic imaging of humans we have used several dual tuned $^{31}P/^1H$ probes, based on crossed, orthogonal Helmholtz resonators for the two frequencies (e.g., see Reference 1 above). Such probes are not easily adapted to laboratory frame quadrature detection for $^{31}P$; so a potential gain of $\sqrt{2}$ in sensitivity is not realized. Furthermore the small aspect ratio required to minimize pick up of extraneous tissue noise leads typically to poor RF homogeneity across the sample in a Helmholtz resonator.

A bird cage resonator is naturally adapted to quadrature operation, and has better RF homogeneity than a Helmholtz coil of comparable aspect ratio. However, the prior dual-tuned bird cage coil (e.g., a band pass configuration) is needlessly complex, if, as in our case, performance of the $^1H$ channel is not nearly so critical.

We have therefore designed a hybrid or composite resonator, in which a quadrature tuned $^{31}P$ bird cage coil is coupled to a $^1H$ half 'Helmholtz' or Alderman-Grant coil (e.g., see Reference 2 above), in such a way that they share a pair of legs. The resulting dual-tuned hybrid resonator has proven fairly easy to build, and simple to operate and has provided $^{31}P$ spectra of outstanding quality.

In brief summary, our composite dual-tuned RF coil provides a plurality of conductive members disposed about an MRI volume and provides plural RF resonances corresponding to NMR of at least two nuclear species. A pair of quadrature-phase RF input/output ports is coupled to a first portion of the coil and provides NMR RF coupling to the MRI volume for a first nuclear species at a first NMR RF frequency. A further RF input/output port is coupled to a second portion of the coil and provides NMR RF coupling to the MRI volume for a second nuclear species at a second NMR RF frequency. Preferably, the pair of quadrature-phase RF input/output ports each include a conductive loop inductively coupled to a central bird cage portion of the coil, the loops being disposed in mutually orthogonal planes.

Viewed from a somewhat different perspective, an exemplary embodiment of our hybrid coil includes at least four conductive rings axially spaced apart and interconnected by axially-extending conductive legs. A pair of quadrature-phase RF input/output ports is coupled to a central portion of the coil while a further RF input/output port is coupled to one of the rings. In this exemplary embodiment, each of the axially-extending legs includes a series capacitance while each of the outer most pair of rings also includes series capacitance. The quadrature-phase RF input/output ports may each include a conductive loop inductively coupled to the central portion between an innermost pair of the rings. This central portion may be constructed as a bird cage RF MRI coil tuned to a first RF frequency (corresponding to NMR frequency of a first nuclear species), while the outer most pair of rings in conjunction with the other conductive members provides a Helmholtz-type RF coil tuned to a second NMR RF frequency corresponding to the NMR of a second nuclear species.

In the exemplary embodiment, a central cylindrical bird cage coil section has spaced apart, parallel, axially-extending leg members interconnected at each of their ends by respectively associated first and second circumferentially-extending ring members. Third and fourth circumferentially-extending ring members respectively disposed at and coupled to opposite axial ends of the bird cage coil section complete the composite or hybrid MRI RF coil structure. A pair of quadrature-phase RF input/output ports may be coupled to the bird cage coil section while at least one additional RF input/output port is coupled to at least one of the remaining third and fourth ring members.

Figure 1:
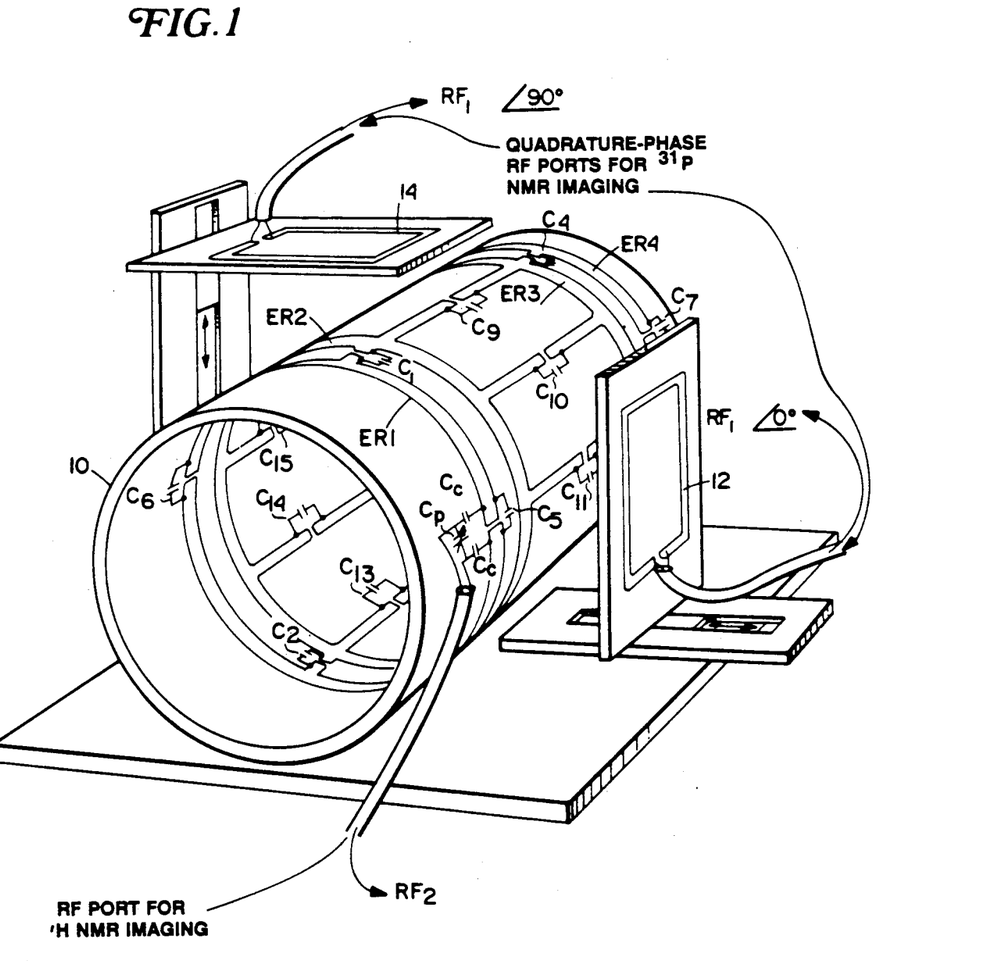
FIG. 1 is an isometric view of an exemplary embodiment of our dual-tuned $^{31}P/^1H$ probe. Copper ribbon is shown for the conductive members while capacitors are schematically depicted if visible. Connectors are omitted. The two rectangular coils mounted on slides are for inductive matching.
Figure 2:
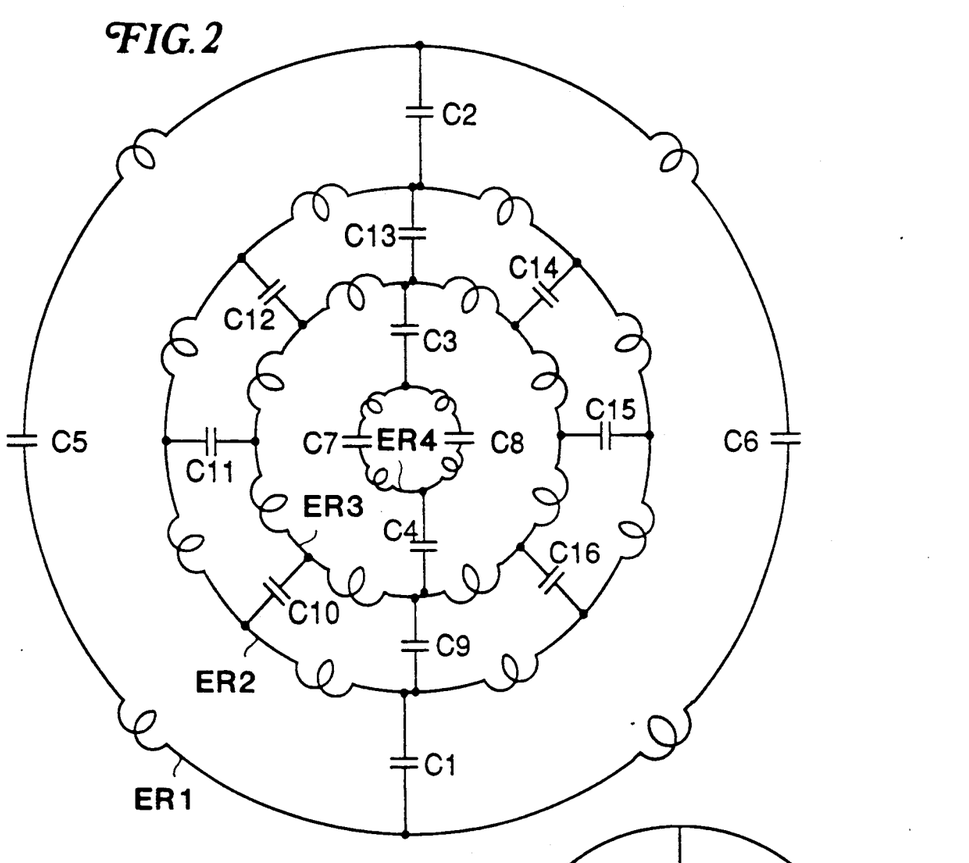
FIG. 2 is a schematic circuit diagram of the exemplary $^{31}P/^1H$ probe shown in FIG. 1. Inductors are not individually labelled, but in all cases consist of segments of copper ribbon.
Figure 3:
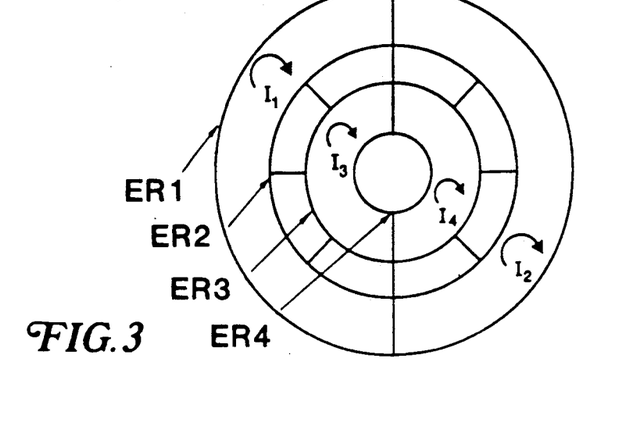
FIG. 3 is a topology graph of the exemplary probe circuit showing the circuit meshes, per se. Note the mesh currents $I_1$ through $I_4$ which are used in describing the proton circuit resonances; the arrows indicate the direction of positive current.

These as well as other objects and advantages of this invention will be better appreciated and understood by careful study of the following detailed description of presently preferred exemplary embodiments taken in conjunction with the accompanying drawings, of which:

FIG. 1 is an isometric view of an exemplary hybrid coil, while FIG. 2 is a schematic and FIG. 3 a topological rendering of the exemplary circuit. All FIGS. 1–3 should be consulted while reading the following description.

The exemplary resonator is constructed on a plexiglass cylinder 10 and comprises four circumferential copper rings (the "end rings", ER1 through ER4) as well as eight axial copper legs, disposed equally about the cylinder axis. The two inner rings, ER2 and ER3, together with the capacitors in the annulus bounded by them (C9–C16), form a low pass bird cage structure; which is capacitively coupled, by C1, C2, C3 and C4, to the two outer rings, ER1 and ER4. These latter constitute the boundary rings of what would be essentially a 'half Helmholtz' resonator if the two inner rings were removed, leaving C9 and C13 in place.

The capacitors are only schematically depicted in FIG. 1. In actual practice, they are physically soldered into place across a break in the copper strapping as will be appreciated by those in the art. The coupling capacitors C1-C4 present a large impedance at the $^{31}$P frequency (e.g., 34.5 MHz). Thus the bird cage section is approximately isolated from the Helmholtz-type circuit at low frequency (e.g., the $^{31}$P frequency) and can be analyzed as a perturbed bird cage using formalism given elsewhere (e.g., see Reference 3 above). Analysis of the Helmholtz-type section is complicated by the fact that the bird cage capacitors (C9-C16) present low impedances at the higher $^1$H frequency (e.g., 85.5 MHz); but a reasonable qualitative analysis is still possible, as will be described later.

Coupling to the bird cage portion of the circuit is inductive, and is achieved by adjustable driving loops 12, 14 straddling two of the bird cage legs in orthogonal polarization planes (e.g., see Reference 3 above). The coupling to the proton frequency on the Helmholtz-type circuit is by a capacitive $C_c$ bridge and tuning-/matching capacitor $C_p$ across C5 or its symmetry equivalent capacitor (i.e., its coupling strength is not so easily adjustable). Both the bird cage and Helmholtz segments are preferably provided with trimmer capacitors (not shown) for frequency adjustment.

In the exemplary embodiment, C1 through C4 were 32 picofarad capacitors, C5 through C8 were 56 picofarad capacitors and C9 through C16 were 68 picofarad capacitors.

The electrical resonance spectrum of the probe is complex, and the spectrum of each of the three coupling ports must be viewed separately. We list in Table 1 the frequencies of the resonances seen through each port:

TABLE 1

Resonant frequencies of the dual-tuned probe (determined from minima of return loss under weak coupling)

| Channel | Mode Frequencies (MHz) | | | |
|---|---|---|---|---|
| $^{31}$P (perpendicular) | 34.5 | 51.3 | 57.7 | 60.0 |
| $^{31}$P (parallel) | 34.5 | 51.3 | 58.1 | 60.0 |
| $^{31}$P calculated, unperturbed | 34.6 | 51.3 | 57.5 | 59.0 |
| $^1$H | | 43.8 | 82.5 | 86.5 |

As will be appreciated, minor adjustments of these resonant frequencies can be made via the usual variable trim capacitances. Thus, while the $^{31}$P resonant frequency is already approximately at the desired 34.5 MHz frequency for a 2.0 Tesla strength magnetic $B_o$ field, one of the $^1$H resonance modes may be shifted via trimmer capacitance to the desired 85.5 MHz frequency for the same ambient $B_o$ field.

The two (quadrature phase) bird cage channels are distinguished by their relationship to the Helmholtz portion. We will refer to the parallel and perpendicular channels, where the designations refer to the relative orientations of the B field lines between the $^{31}$P channel of interest and the $^1$H channel. Following prior discussions of the perturbations of the symmetry of bird cage resonators (e.g., see Reference 3 above), we surmise that the perpendicular channel should be unaffected by the presence of the Helmholtz-type resonator, and take its spectrum as a model of ideality. For comparison, we include in Table 1 the calculated unperturbed resonant frequencies, using Eq. [6] from Reference 3 above.

The proton channel gives three resonances which were assigned by measuring the RF field distribution and polarization with a small pick up coil, and by noting the sensitivity of return loss to finger touch at various points on the coil. The lowest frequency mode, a doublet, corresponds to uncoupled series resonances of the outer end rings ER1 and ER4. The other two resonances, at 82 and 86 MHz, correspond to linear combinations of resonances involving the circulating currents $I_1$ through $I_4$, as we shall now describe.

Using Dirac notation, denote by the ket $|I_n>$ (for n=1 to 4) an excitation of the coil consisting of a positive mesh current $I_n$. Then define the states $|1>$ and $|2>$ by $|1 22 = |I_1> - |I_2>$ and $|2> = |I_3> - |I_4>$. Finally, consider the symmetric and antisymmetric linear combinations $|S> = |1> + |2>$ and $|A> = |1> - |2>$. The state $|S>$ (at 86.5 MHz) produces voltage drop across both C9 and C3 and is therefore associated with current flow through these capacitors, (and to some extent, the other bird cage capacitors as well) while the state $|A>$ (at 82 MHz) produces no current through the legs of the bird cage. Thus, only $|S>$ gives a current through the bird cage section; and while the exact distribution is unknown, the symmetry is such as to produce a linearly polarized B field.

The dimensions of the exemplary bird cage (diameter = 24 cm, length = 16 cm) where optimized for head imaging using a program we have written for the purpose of evaluating different probe designs. The program maps the sensitivity of a given coil by calculating $B_1\sqrt{R}$, where $B_1$ is the magnitude of the transverse component of the magnetic field produced by unit current in the probe and R is an effective resistance due to both losses in the coil and in the head (e.g., see Reference 4 above).

If the resistance of the coil is either known or is much smaller than the coupled resistance due to the head, the calculation reduces to that of two quantities: $B_1$ of the coil, and the contribution to effective resistance from the head. Calculation of $B_1$ is straightforward (assuming the long wavelength limit), whereas the determination of effective resistance is more difficult.

We assume the coil's capacitance has been sufficiently distributed so that inductive losses dominate and model the head as a conducting, dielectric sphere. To calculate the inductive losses we follow an approach due to Carlson (e.g., see References 5 and 6 above). Using this method we can express the power deposition in the sphere as an infinite series involving the expansion coefficients of the scalar r·B, where r is the position vector relative to the center of the sphere, and B is the free space magnetic field distribution due to current in the probe. Specifically, if r·B is expanded in spherical harmonics as $$r \cdot B = \sum_{l,m} l\beta_{lm} r^l Y_{lm} \quad [1]$$

we calculate the power deposition to be $$P = \frac{w}{2\mu|k|^2} \sum_{l,m} \frac{l(2l+1)^2 a^{2l}}{(l+1)|J_{l-1/2}(ka)|^2} |\beta_{lm}|^2 Im[k^* J_{l-1/2}(ka) J_{l-1/2}(k^* a)] \quad [2]$$

where a is the radius of the sphere, $\mu$ is the permeability of the sphere, w is the frequency of the driving current, $J_1$ is a Bessel function of the first kind, and k is the complex wave vector. This expression is equivalent to Eq. [7] of Reference 6 above, with the replacement of $j_{l-1}(ka)$ by $|j_{l-1}(ka)|^2$ in the denominator of the latter. If we calculate the power deposition at unit current in the coil, the effective resistance is just twice the time averaged power.

Figure 4:
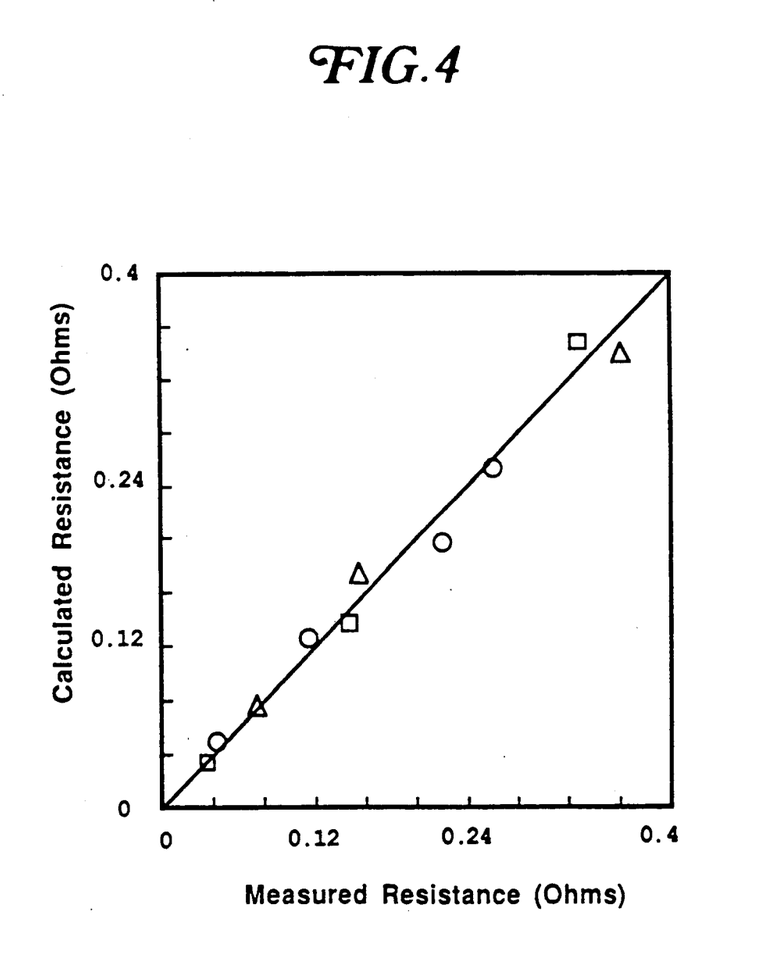
FIG. 4 is a graph of calculated effective resistance versus measured effective resistance for various coils near a head. The circles represent a circular coil, 13 cm diameter, resonating at 41 MHz, placed 3 cm above the head plus a lateral displacement of zero, 4, 8 and 12 cm. The rectangles represent a rectangular coil 10×15 cm, placed 3 cm above the head and resonating at 46, 32, and 16 MHz. The triangles represent an equilateral triangular coil 15 cm on a side, resonant at 61 MHz, placed 3, 5 and 7 cm above the head. Measurement error is estimated at 5%, being dominated by Q measurement error at low resistance and positioning error at high resistance.

We have compared calculated and measured resistances using both spherical phantoms and heads in conjunction with several simple coil geometries. For calculations involving heads we use the dielectric constant and conductivity suggested in Reference 5 above, with the permeability set to that of free space. Convergence of the series is ensured by evaluating it up to l=15. The effective resistance is measured by noting the difference in Q between loaded and unloaded coils. FIG. 4 demonstrates the agreement between measurement and calculation for various coils in the proximity of a head.

Coil optimization generally reduces to finding an acceptable compromise between sensitivity and uniformity. This is an inexact science, as a fair degree of trial and error is involved, and, finally, the 'best' compromise is a subjective judgment. Our computer program does not eliminate the trial and error aspect of coil design, it does, however, speed the process considerably by replacing the time consuming step of building and mapping the sensitivity of a probe design with a five minute calculation.

Figure 5:
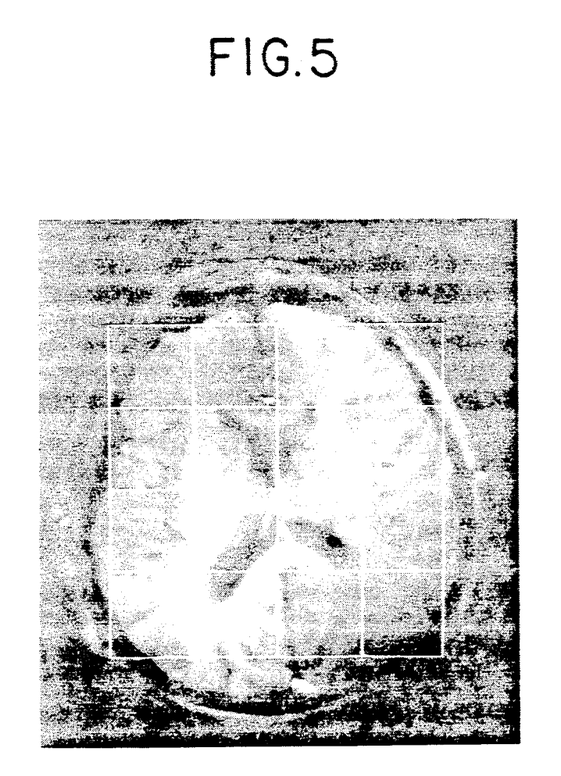
FIG. 5 is a proton image of a transaxial slice through normal human brain, with a grid for phosphorus $^{31}P$ spectroscopic imaging superimposed.
Figure 6:
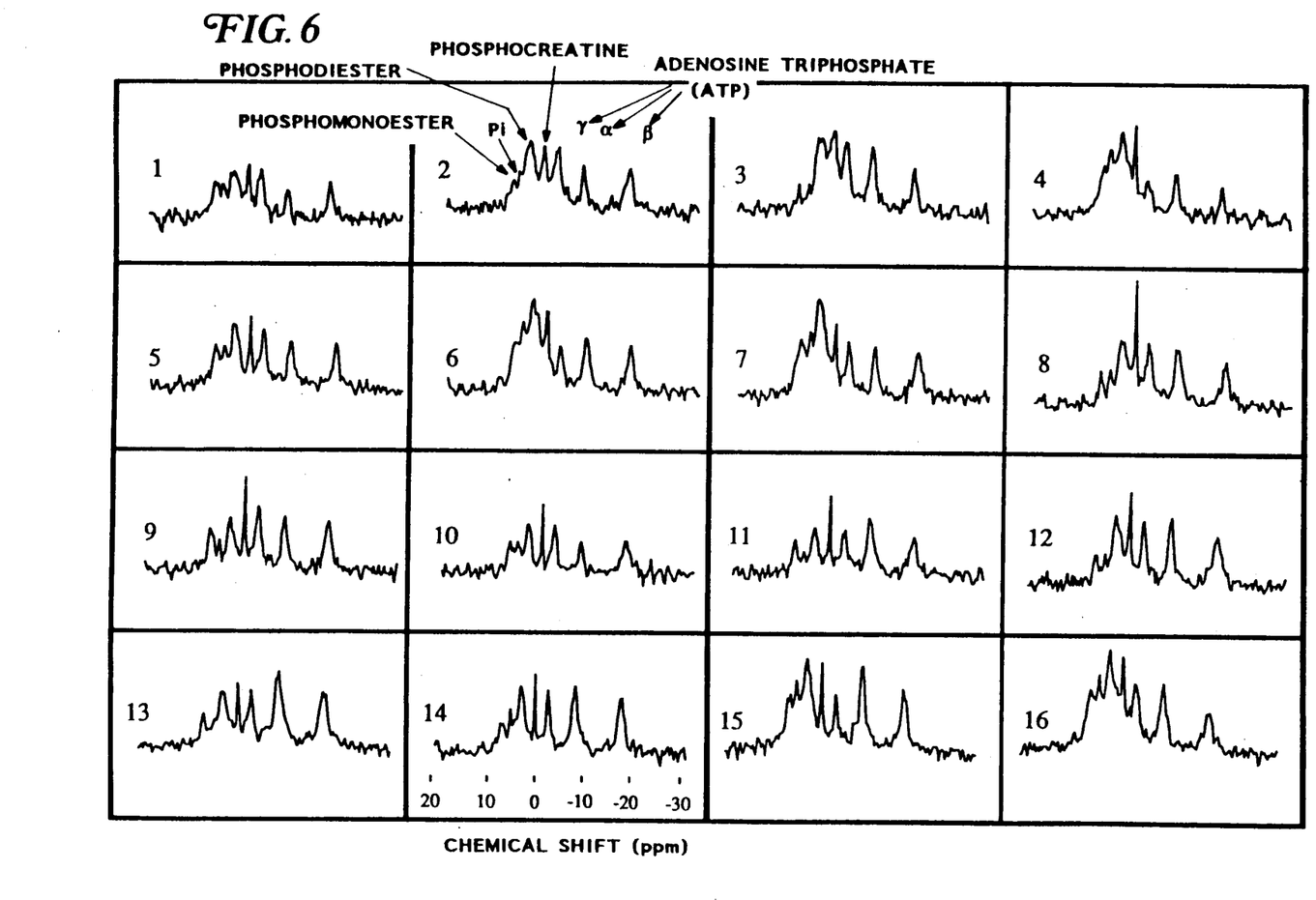
FIG. 6 is a set of phosphorus spectra obtained from the voxels indicated by the superimposed grid in FIG. 5. The spectra have been shifted, filtered (8 Hz exponential), phased, and baseline corrected.

In FIG. 5 we present the results of a typical scan obtained using our final exemplary probe design. The spectra were obtained at 2.0 T with 35 minutes of averaging time. Data acquisition was by FID, with two dimensions of phase encoding (16×16 with 3.3 cm resolution), the third dimension is defined by a slice select gradient (3 cm resolution). Further details of the experimental procedure may be found in References 7 and 8 above. Data processing consisted of voxel shifting in the phase encoded dimensions via application of the Fourier shift theorem (e.g., see Reference 9 above) followed by phase correction and baseline deconvolution. The phase and baseline correction are done by our spectral quantitation program, which performs a constrained, maximum likelihood fit in the time domain (e.g., see References 9 and 10, above). Relative to our crossed Helmholtz probe, we observe a more uniform sensitivity distribution, and we estimate (using the fit signal amplitudes) a 20% gain in average sensitivity.

Although only one exemplary embodiment has been described in detail, those skilled in the art will realize that many modifications and variations may be made in this exemplary embodiment while yet retaining many of the novel features and advantages of this invention. Accordingly, all such modifications and variations are intended to be include within the scope of the appended claims.

What is claimed is:

1. An RF coil for MRI spectroscopy, said coil comprising:
    a bird cage coil tuned to resonate at a first NMR frequency; and
    a Helmholtz-type coil capacitively coupled with said bird cage coil and tuned to resonant at a second NMR frequency.

2. An RF coil for MRI spectroscopy as in claim 1 further comprising:
    a pair of inductive coupling loops inductively coupled in quadrature phase relationship to said bird cage coil for coupling a pair of quadrature RF signals at said first NMR frequency to/from said bird cage coil.

3. An RF coil for MRI spectroscopy as in claim 2 further comprising:
    an input/output RF port coupled to said Helmholtz coil across a series capacitor in said Helmholtz coil for coupling RF signals at said second NMR frequency to/from said Holmholtz coil.

4. An RF coil for MRI spectroscopy, said coil comprising:
    a central cylindrical bird cage coil section having spaced-apart, parallel, axially-extending leg members interconnected at each of their ends by respectively associated first and second circumferentially-extending ring members;
    third and fourth circumferentially-extending ring members respectively disposed at and coupled to opposite axial ends of said bird cage coil section.

5. An RF coil for MRI spectroscopy as in claim 4 further comprising:
    a pair of quadrature-phase RF input/output ports coupled to said bird cage coil section; and
    at least one RF input/output port coupled to at least one of said third and fourth ring members.

6. An RF coil for MRI spectroscopy as in claim 4 wherein:
    each of said leg members includes a series capacitance;
    each of said third and-fourth ring members include at least one series capacitance; and
    each of said third and fourth ring members is coupled to its respectively associated first or second ring member by a pair of further axially-extending leg members having serial capacitances.

7. An RF coil for MRI spectroscopy, said coil comprising:
    at least four conductive rings axially spaced apart and interconnected by axially-extending conductive legs;
    a pair of quadrature-phase RF input/output ports coupled to a central portion of the coil; and
    a further RF input/output port coupled to one of said rings.

8. An RF coil for MRI spectroscopy as in claim 7 wherein:
    each of said axially-extending legs includes a series capacitance;
    each of an outermost pair of said rings includes series capacitance;
    said pair of quadrature-phase RF input/output ports each include a conductive loop inductively coupled to said central portion between an innermost pair of said rings.

9. An RF coil for MRI spectroscopy as in claim 8 wherein:

said central portion provides a bird cage RF coil tuned to a first RF frequency corresponding to NMR of a first nuclear species; and said outermost pair of rings in conjunction with the other conductive members provides a Helmholtz-type RF coil tuned to a second RF frequency, corresponding to NMR of a second nuclear species.

10. An RF coil for MRI spectroscopy, said coil comprising:
   a plurality of conductive members disposed about an MRI volume and providing plural RF resonances corresponding to NMR of at least two nuclear species;
   a pair of quadrature-phase RF input/output ports coupled to a first portion of said coil providing NMR RF coupling to said MRI volume for a first nuclear species at a first NMR RF frequency; and
   a further RF input/output port coupled to a second portion of said coil providing NMR RF coupling to said MRI volume for a second nuclear species at a second NMR RF frequency.

11. An RF coil for MRI spectroscopy as in claim 10 wherein said pair of quadrature-phase RF input/output ports each include a conductive loop inductively coupled to a central portion of said coil, the loops being disposed in mutually orthogonal planes.

12. An RF coil for MRI spectroscopy as in claim 10 wherein at least some of said conductive members each include serial capacitance.

* * * * *